United States Patent [19]
Ray et al.

[11] Patent Number: 5,858,471
[45] Date of Patent: *Jan. 12, 1999

[54] SELECTIVE PLASMA DEPOSITION

[75] Inventors: Mark A. Ray, Cary; Gary E. McGuire, Chapel Hill, both of N.C.

[73] Assignee: Genus, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 724,967

[22] Filed: Oct. 3, 1996

Related U.S. Application Data

[63] Continuation of Ser. No. 225,176, Apr. 8, 1994, abandoned.

[51] Int. Cl.$^6$ .......................... C23C 14/00; C23C 14/04; C23C 14/14; H05H 1/02
[52] U.S. Cl. .......................... 427/524; 427/526; 427/530; 427/531; 427/570; 427/577; 427/576; 204/192.16; 204/192.17; 204/192.3
[58] Field of Search ...................... 427/523, 525, 427/526, 530, 531, 570, 571, 573, 576, 577, 249, 250, 255.3, 524; 204/192.14, 192.16, 192.17, 192.22, 192.3; 423/446

[56] References Cited

U.S. PATENT DOCUMENTS

| | | | |
|---|---|---|---|
| 4,419,203 | 12/1983 | Gibson | 204/192.16 |
| 4,613,400 | 9/1986 | Tam et al. | 427/579 |
| 4,629,635 | 12/1986 | Brors | 427/255.2 |
| 4,756,810 | 7/1988 | Lamont, Jr. et al. | 204/192.3 |
| 4,790,920 | 12/1988 | Krzanich | 204/192.17 |
| 4,816,294 | 3/1989 | Tsuo et al. | 427/582 |
| 4,842,710 | 6/1989 | Freller et al. | 204/192.16 |
| 4,957,604 | 9/1990 | Steininger | 204/192.16 |
| 4,959,136 | 9/1990 | Hatwar | 204/192.16 |
| 4,963,239 | 10/1990 | Shimamura et al. | 204/192.3 |
| 4,969,415 | 11/1990 | Bartha et al. | 427/576 |
| 4,980,197 | 12/1990 | Suhr et al. | 427/576 |
| 4,981,923 | 1/1991 | Hirase et al. | 427/255.2 |
| 5,093,151 | 3/1992 | van der Berg et al. | 427/577 |
| 5,108,569 | 4/1992 | Gilboa et al. | 204/192.17 |
| 5,122,249 | 6/1992 | Niemann et al. | 204/192.16 |
| 5,124,014 | 6/1992 | Foo et al. | 438/789 |
| 5,175,017 | 12/1992 | Kobayashi et al. | 427/576 |
| 5,207,836 | 5/1993 | Chang | 156/643 |
| 5,221,640 | 6/1993 | Sato | 437/157 |
| 5,246,741 | 9/1993 | Ouhata et al. | 204/192.16 |
| 5,286,676 | 2/1994 | Kruger et al. | 204/192.17 |
| 5,364,664 | 11/1994 | Tsubouchi et al. | 427/576 |
| 5,368,937 | 11/1994 | Itoh | 427/577 |
| 5,393,699 | 2/1995 | Mikoshiba et al. | 427/576 |
| 5,656,337 | 8/1997 | Park et al. | 427/576 |
| 5,712,000 | 1/1998 | Wei et al. | 427/573 |
| 5,783,282 | 7/1998 | Leiphart | 204/192.17 |

FOREIGN PATENT DOCUMENTS 430303  6/1991  European Pat. Off. .

OTHER PUBLICATIONS

Skelly et al, "Significant Improvement in Step Coverage Using Bias Sputtered Aluminum", *J. Vac. Sci. Technol.* A 4(3) pp. 457–460, May/Jun. 1986.

Homma et al, "Planar Deposition of Aluminum by RF/DC Sputtering with RF Bias", *J. Electrochem. Soc., Solid State Sci. & Technol.* vol. 132 #6 pp. 1466–1472, Jun. 1985.

Yamazaki et al "Selective CVD Tungsten . . . " Jun. 12–13, 1989 VMIC Conference, IEEE pp. 151–157.

*Primary Examiner*—Marianne Padgett
*Attorney, Agent, or Firm*—Donald R. Boys

[57] ABSTRACT

A deposition process provides selective areal deposition on a substrate surface having separate areas of different materials comprises forming a plasma over the substrate, injecting coating species into the plasma by either of sputtering or gaseous injection, adding a reactive gas for altering surface binding energy at the coating surface, and biasing the substrate during deposition to bombard the substrate with ionic species from the plasma. Surface binding energy is altered, in the general case, differently for the separate areas, enhancing selectivity. Bias power is managed to exploit the alteration in surface binding energy. In the case of gaseous injection of the coating species, and in some cases of sputtering provision of the coating material, the temperature of the substrate surface is managed as well. In an alternative embodiment, selectivity is to phase of the coating material rather than to specific areas on the substrate, and a selected phase may be preferentially deposited on the substrate.

32 Claims, 7 Drawing Sheets

SELECTIVE PLASMA DEPOSITION

CROSS REFERENCE TO RELATED APPLICATIONS

This is a continuation of application Ser. No. 08/225,176 filed Apr. 8, 1994, now abandoned.

FIELD OF THE INVENTION

The present invention is in the area of apparatus and methods for depositing films in general, and relates in particular to deposition of films of different materials on selected areas of substrates, and to deposition of different phases of a single material on a substrate. The invention has particularly application in processing semiconductor wafers as a manufacturing step in producing integrated circuits.

BACKGROUND OF THE INVENTION

There are a number of manufacturing disciplines wherein selective film deposition may be beneficial. Perhaps the most prevalent of these is the manufacture of integrated circuits.

Manufacturing of integrated circuits is generally a procedure of forming thin films and layers of various materials on wafers of base semiconductor material, and selectively removing areas of such films to provide structures and circuitry. Doped silicon is a typical base wafer material. Chemical Vapor Deposition (CVD) and physical vapor deposition (PVD) are well known processes for depositing such thin films and layers in manufacture of integrated circuits and in other thin-film manufacturing. Sputtering is one example of a well-known and much-used PVD process.

As an example of CVD, polysilicon may be deposited from silane gas, $SiH_4$. It is known, too, among many other processes, to deposit tungsten silicide from a mixture of gases including silane and a tungsten-bearing gas such as tungsten hexafluoride. Pure tungsten is also deposited on silicon wafers in the manufacture of integrated circuits, sometimes selectively and sometimes across the entire surface in a process known as blanket tungsten deposition.

One of the better known processes (and applications) of sputtering is deposition of aluminum electrical connections between solid state devices in manufacturing of integrated circuits. There are likewise many other applications for PVD generally and sputtering in particular.

In development of manufacturing techniques for integrated circuits and for many other products, a broad range of variations and combinations of both PVD and CVD techniques have been developed. For example, compounds, such as nitrides of metals, may be deposited by introducing a reactive gas, in this case nitrogen, into the typically inert gas (typically argon) used in the sputtering process to form a plasma.

A typical procedure for forming devices and interconnective circuitry on semiconductor wafers is one of coating the entire wafer with a film of a particular material, followed by patterning by techniques of photolithography, then etching to selectively remove unwanted regions of material, leaving selected patterns of the deposited material in place on the wafer surface. Patterning is also accomplished by means of application of photoresist material, curing of portions of the photoresist in a desired pattern, and removal of uncured photoresist material. The result of photoresist patterning is much the same as selective removal of other films; that is, a surface having patterned regions of more than one material.

Formation of conductive, connective circuitry between devices on a wafer is an example of a typical sequence of deposition, patterning, and selective removal of film regions. Coating device contacts in integrated circuits with materials providing high electrical conductivity and barrier characteristics to diffusion of materials is another example of a process typically accomplished by blanket coverage followed by patterning and selective removal, such as by etching.

There are manufacturing costs associated with every process step undertaken during wafer fabrication. It is also true that reliability and yield are adversely affected by additional processing. Any development that reduces the number and complexity of process steps is therefore generally beneficial.

One conceivable way to reduce the number of processing steps in semiconductor manufacturing is by developing processes for selective deposition. That is, if material can be deposited just on the regions of a wafer where the material is desired to remain, the additional steps of patterning and selective removal may be eliminated, along with the costs and reduced yields incurred by the additional steps.

Limited examples of selective deposition are known in the art. In the art of sputter deposition, for example, biased sputtering techniques have been demonstrated wherein the receiving substrate is biased, and so-called back sputtering of material from the receiving surface is accomplished during deposition. Under carefully controlled conditions, because sputtering rates may differ for a single species deposited on different material surfaces, active sputtering of the wafer surface may result in net material buildup on areas of one material, while areas of another material are held to no net gain in material thickness, or even a small net loss (sputter etched). A necessary condition to selectivity is that the region or regions desired to be coated are surfaces of a different material than the region or regions not to be coated.

Residual damage of silicon substrates and devices has been found to be a problem with biased sputtering, due to relatively high energy levels of bombarding species typically required to sputter etch materials.

Selective deposition has also been demonstrated in CVD processing, due primarily to preferential chemical activity at the surface of a particular material. For example, tungsten may be selectively deposited on silicon regions exposed through silicon dioxide, while there is no net deposition of tungsten on the regions of silicon dioxide. In this selective process, initial deposition of tungsten on silicon is through chemical reduction of $WF_6$ by silicon. The oxide surface does not react chemically, so there is no net deposition on that surface. After initial deposition, and silicon is no longer available to the reactive gases as a reducing agent, an alternate agent must be added, typically hydrogen. In this case, as in the biased sputtering example described above, regions of different material are a necessary condition to selectivity.

A very important advantage expected for techniques of selective deposition is that, with a continuing trend to higher and higher device density, typical geometry has fallen below one micron. In the region of sub-micron geometry, patterning and selective removal become quite difficult. Selective deposition, however, is not limited by patterning considerations.

Presently known selective techniques are not without problems. These techniques, for example, are very limited in the range of materials that may be deposited, and often, as in the case of biased sputtering, unwanted damage to existing devices and structures occurs.

What is clearly needed is a means to selectively deposit a broad range of materials and/or phases of materials, including electrically insulating materials, with controllable selectivity, and with minimal damage to material and device structures.

SUMMARY OF THE INVENTION

In an embodiment of the invention, a method is provided for area-selective deposition on a patterned substrate surface having a first area of a first material and a second area of a second material. The method comprises steps of (a) forming a gas plasma over the substrate surface, (b) introducing a coating species into the plasma, (c) introducing a reactive gas into the plasma, the reactive gas selected to alter the surface binding energy of coating species at the substrate surface, (d) electrically biasing the substrate surface to attractions from the plasma to bombard the substrate surface, and (e) managing the bias power at a value above the value for zero net deposition rate for the first area and below the value for zero net deposition rate for the second area. In some cases the coating species is introduced by gaseous injection into the plasma, and in others by sputtering from a solid target.

In the case of gaseous injection, the substrate temperature is also managed to initiate deposition by CVD techniques. Substrate temperature is also managed in some cases wherein the coating species is introduced by sputtering from a solid target, to aid, for example, in desorbing volatile species from the substrate surface.

In an alternative embodiment of the invention, phase selectivity is provided rather than areal selectivity. In the case of phase selectivity, a method is provided for depositing diamond and diamond-like films by sputtering from a graphitic-phase target onto the substrate, and managing the substrate bias level and temperature.

The methods of the present invention provide selectivity for materials not before selectively deposited, for widened process windows in selectivity and also provide for substrate biasing in selective deposition at levels less damaging to the substrate and its structures than experienced by conventional techniques.

DESCRIPTION OF THE PREFERRED EMBODIMENTS

Figure 1:
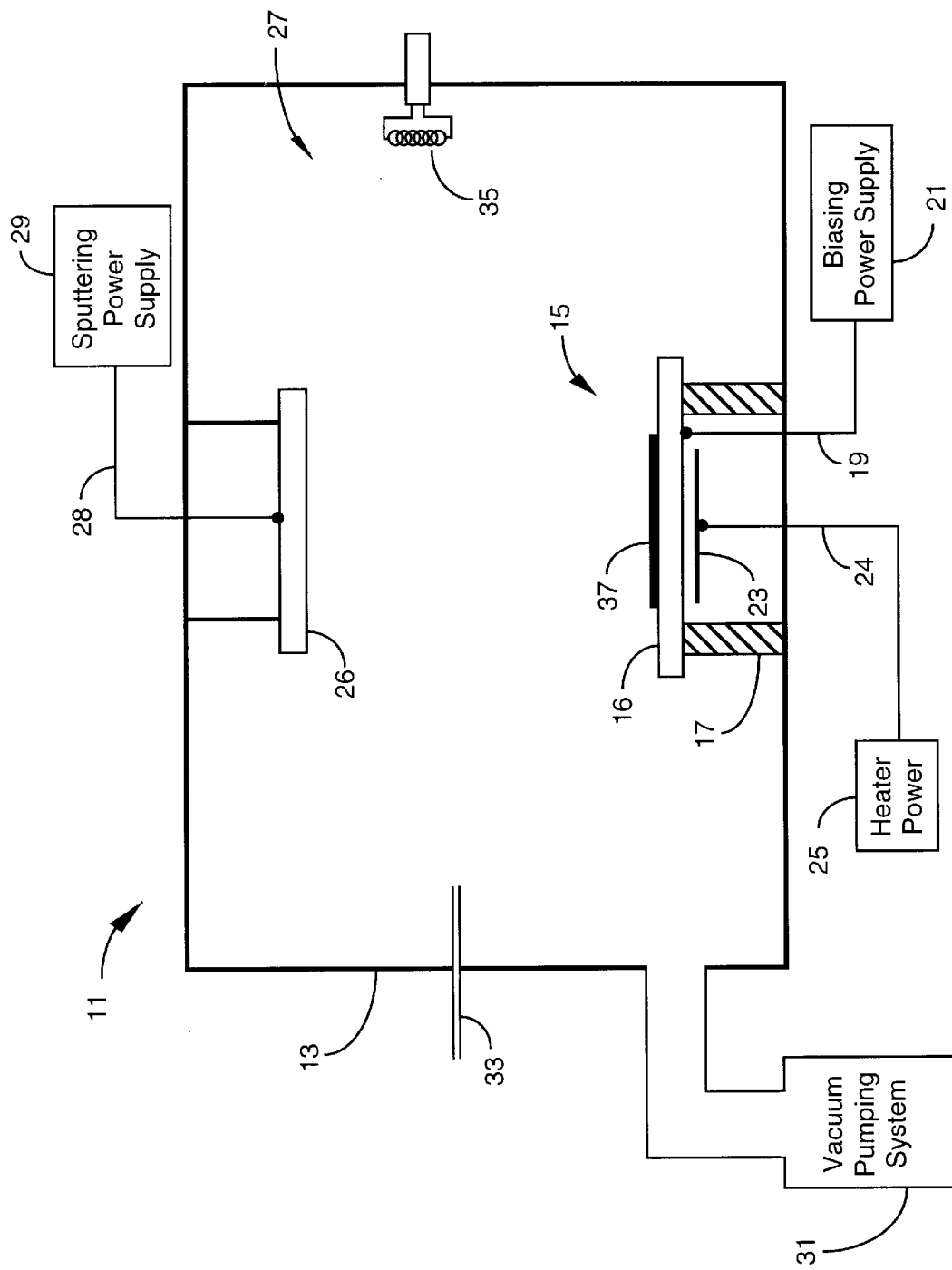
FIG. 1 is a largely schematic representation of a system 11 according to an embodiment of the present invention.

Selective deposition techniques in embodiments of the present invention are termed by the inventors Selective Plasma Deposition (SPD). This term will be used throughout the present specification.

SPD is a unique process in one aspect for depositing a film of a desired coating material on specific (selected) regions of a substrate, while no net deposition of the coating material occurs on other regions of the same substrate. This will be discussed herein as areal selectivity. In another aspect of SPD selectivity is to different forms of a single coating material on a common surface. This will be discussed herein as phase selectivity.

Areal selectivity in SPD techniques exploits the circumstance of different surface characteristics in specific regions on tile surface of a substrate. This circumstance occurs, in most cases, from previous coating, patterning, and film removal steps, leaving different materials exposed in specific substrate regions.

In the technique of SPD, the coating material can come from a sputtering target or from a gas phase material introduced into the chamber, that is, the primary mechanism of coating can be CVD or PVD. The source of coating material is not limiting in the present invention. In SPD, a plasma is created in the vicinity of the substrate to be coated, regardless of the mechanism for supplying coating material, and the substrate is biased to promote back sputtering of material at the substrate surfaces. Selectivity results from differing rates of back sputtering over different surface regions of a substrate.

SPD differs from known selective deposition techniques in that SPD employs gaseous additives to the plasma to manipulate the surface binding energy ($E_{SB}$) of deposited species, and substrate temperature control and ionic bombardment to influence nucleation and material accumulation at the substrate surface. As such, SPD may be described as a phenomenon at the point-of-process in deposition.

A considerable amount of study has been accomplished by various workers in the art relative to the phenomena that occur in film deposition, and various models have been suggested, not all in agreement. It may be fairly said, however, that the chemical and physical phenomena at the coating surface are very complicated and dynamic. It is generally agreed, for example, that arriving atoms and groups of atoms in PVD processes, like sputtering, do not immediately adhere to the surface at the point of arrival. Rather, there is a variable mobility depending on a number of factors, such as arrival energy (mass and velocity), temperature of the surface and of the arriving species, the material and physical characteristics of the surface to be coated, presence of certain chemicals, which may be contaminants, and so on.

Adhesion (bonding) may be attributed to several mechanisms generally given the names of ionic, Van der Waals, metallic, and covalent (chemical). Additives can effect $E_{SB}$ in a number of ways. For example, most molecules exhibit some degree of polarity, due to geometry of chemistry. The polarity of molecules affects $E_{SB}$, and by judicious choice of chemical additives in SPD, atoms in molecules may be replaced, producing a population of molecules with altered polarity. As another example, covalent bonding may be affected by reactive species, by altering reactivity.

By judicious choice of additives and careful control of other processing variables, two beneficial results may be attained in areal SPD. The first is that the phase space for selectivity may be widened, allowing increases in deposition rate and a wider processing window. The second is that $E_{SB}$ for deposited species is significantly lowered for the regions of the substrate where coating is not desired, facilitating the mechanisms by which net film deposition on these regions is prevented.

In areal SPD several mechanisms are exploited for preventing net film deposition on regions where coating is not desired. One is by bombardment with ions attracted from the plasma established over the substrate, as is done in ion etching and biased sputtering processes. Another is by removal of weakly bound species through control of substrate temperature. Yet another is by volatilization of deposited material as in reactive ion etching (RIE).

A significant difference between SPD and conventional processes is that SPD provides for significantly lower $E_{SB}$ values for deposited species on the areas not to be coated, allowing net deposition to be discouraged and prevented by low-energy techniques. That is, in SPD, substrate temperature and substrate bias voltage may be used that are lower than thresholds generally required in prior art processes.

FIG. 1 is a largely schematic representation of a system 11 according to the present invention, for practicing SPD. System 11 comprises a processing enclosure 13 providing a processing volume 27 and a substrate support apparatus 15, including a pedestal 16 and an insulator 17. The insulator is for electrically isolating the substrate support from the enclosure and other elements. Pedestal 16 has electrical connection represented by line 19 to a biasing power supply sub-system 21. A pedestal heater apparatus 23 is provided adjacent pedestal 16 for heating the pedestal. The heater has electrical connection represented by line 24 to a heater power supply 25.

An optional sputtering apparatus 26 is positioned generally opposite pedestal 16 in another part of processing volume 27 and electrically connected by line 28 to a sputtering power supply 29. There are many sorts of sputtering apparatus known in the art.

A vacuum pumping system 31 is coupled to the processing enclosure for initial evacuation of the processing volume and for pumping processing gases during operation, generally at sub-atmospheric pressure. The vacuum system may in some embodiments be throttled and/or connected to the chamber through a shut off valve. Processing gases are provided to the processing volume at one or more inlets such as inlet 33, through apparatus (not shown) for controlling the flow of process gases.

In addition to the above elements a filament 35 is provided for furnishing electrons for plasma ignition and support. In some embodiments, depending on such things as processing gases, operating pressure, and type of sputtering apparatus (if used), a filament is not needed.

In operation, a substrate 37 to be coated is supported on pedestal 16 such that the temperature of the substrate may be controlled by heat passed through pedestal 16 from heater 23. The substrate may also be electrically biased by use of biasing power supply 21. In one embodiment substrate 37 represents a semiconducting silicon wafer at some point in integrated circuit manufacture. Integrated circuit manufacture is a major application for SPD.

As stated above, FIG. 1 is largely schematic, and may represent many configurations. The horizontal orientation of pedestal 16, for example, is exemplary only. In some systems one or more substrate support pedestals support substrates vertically or at various angles according to material handling requirements and constraints. And, although FIG. 1 shows a single pedestal, batch processing systems in some embodiments may employ multiple pedestals. It is also known to use valved load-locks (not shown) to facilitate the passage of substrates into and out of the processing volume without exposure of the interior of the volume to ambient atmospheric gases. In any case, although not shown in FIG. 1, there is apparatus and interface provided for moving unprocessed wafers into position to be processed, and for removing processed wafers from the system.

It is known to use a number of different sorts of vacuum pumping systems to accomplish evacuation and pumping of processing gases in operation, and the choice is largely dependent on specific application. In some cases turbomolecular pumps might be used, in other cases cryogenic pumping is preferred. In addition, the pumping port or ports may be valved for service and throttled as an aid to controlling gas pressure in processing.

In those embodiments where primary coating material is supplied by sputtering, and a sputtering apparatus 26 is used, apparatus 26 may be selected from many commercially available sputtering devices. The choice is dependent on such parameters as system size and configuration, the sputtering material to be supplied, power requirements, target availability, and the like. Among many choices are planar magnetron devices in many sizes and sputter guns employing annular targets. Some sputtering devices are configured for DC power and others for AC, generally in the RF range. RF sources are useful for sputtering electrically non-conductive materials, for example.

Some commercially available sputtering devices provide closed magnetic field penetrating target materials for providing magnetic plasma enhancement. In various embodiments of the invention any one of the available types of sputtering devices are useful. In some embodiments no sputtering unit is required.

As described above, in SPD the primary source of material deposited (coating material) can be either a solid sputtering source (target) or a gas phase source introduced into the processing volume under controlled conditions. In either case, a plasma is maintained over the substrate.

The substrate to be coated by SPD is electrically biased, and ions from the plasma are accelerated to the substrate to preferentially remove material from regions of the substrate exhibiting a surface of one material, while a film of coating material forms on regions having a surface of another material. Gas phase additives are introduced in the plasma to control $E_{SB}$ of film forming material to surface materials at the point of process, thereby controlling the threshold energy at which arriving ions will remove material from regions of the substrate, also at the point of process.

In many embodiments, substrate temperature is also controlled to influence $E_{SB}$. In those applications employing CVD techniques, substrate temperature is also controlled to influence deposition of coating material from gaseous sources.

The particular scientific field of the present inventors is microelectronics, including techniques for manufacturing integrated circuits. The techniques of SPD have important application in this field, but are by no means limited to applications in microelectronics. Descriptive examples of SPD throughout this specification will be drawn from the field of microelectronics and integrated circuit manufacture, because of the inventors' particular expertise.

Selective deposition of metals has been previously accomplished using ion bombardment of the growing film on the substrate in sputtering processes. The $E_{SB}$ values of sputtered metal films on the usually encountered material surfaces of substrates in integrated circuit manufacture, such as silicon, silicon oxides, aluminum, and other metals, are known to be high. Therefore sputtering thresholds are high, and yield per incident ion is commensurately low. High incident ion energy is necessary to accomplish selective deposition. That is, to remove material from one material surface while a net film formation is accomplished on another, requires incident ion energy high enough to cause structural damage to the silicon substrate and damage to and removal of finely patterned features in the substrate structure.

Another problem associated with high incident energy of arriving ions is that the heating effect of high energy bombardment makes substrate temperature more difficult to control, and may result in local damage and possibly surface melting of materials with low melting points.

Also, direct and remote plasma enhanced CVD techniques have been developed, but these deposition techniques do not employ ion bombardment of the substrate. Typically, the plasma in these processes is used to activate the desired species for growth, and the coating species strike the substrate with near thermal energies.

SPD From a Solid Source

The system schematic of FIG. 1 is general for SPD, and reference to this figure is made below for further description of embodiments of the present invention. In the case of SPD from a solid source (sputtering) apparatus 26 is the device that provides primary coating material to the plasma. Material is provided, as those with skill in the art will recognize, by ion bombardment of a target in the sputtering device at energy levels sufficient to separate atoms and groups of atoms from the surface of the target, providing a flux of atoms, groups of atoms, ions, and ion clusters toward the substrate to be coated. In the case of SPD from a solid source, the film material accruing on selected regions of the substrate will be, in some cases, the material sputtered originally by device 26, and in other cases one or more compounds of that material, due to reactive species in the plasma.

Figure 2:
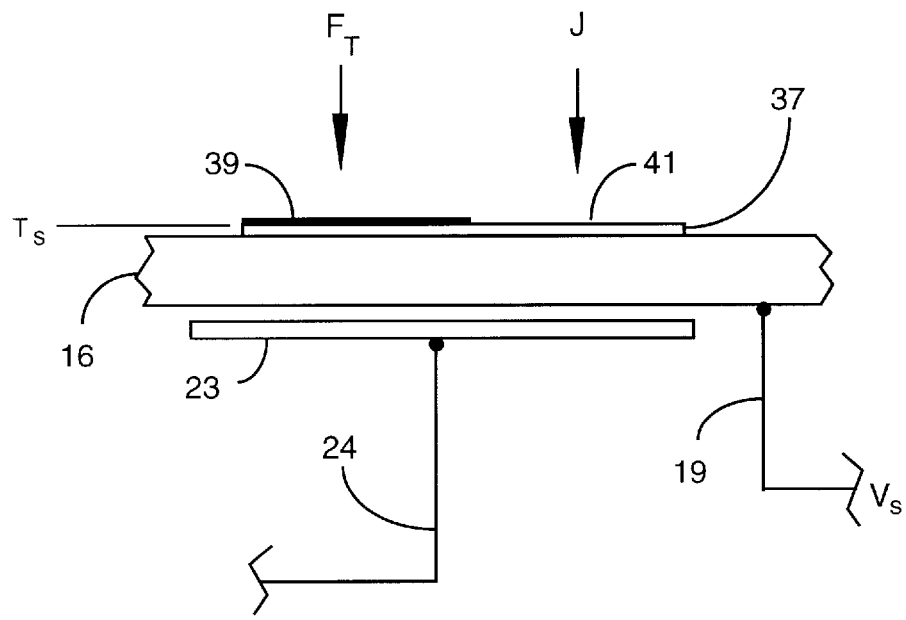
FIG. 2 is a generalized elevation view of a portion of FIG. 1.

FIG. 2 is a generalized elevation view of a portion of FIG. 1, showing substrate 37 resting on pedestal 16 with heater 23 behind the pedestal. In FIG. 2 the substrate has been previously processed, and there are surface regions 39 and 41 of two different materials. Substrate 37 is biased at a controlled voltage $V_S$ by virtue of the substrate contacting pedestal 16 which is biased via line 19. The temperature of pedestal 16, hence substrate temperature $T_S$ for substrate 37, may be controlled by control of heater 23. Vector $F_T$ represents an incident flux of sputtering target ions, and vector J represents an incident flux of plasma ions attracted to the surfaces of substrate 37 by virtue of bias voltage $V_S$.

It is known that in bias sputter deposition, especially at the region of near zero deposition rate, surface phenomena, such as sticking coefficient, nucleation, et al., are material dependent. Partially for this reason, in the situation illustrated by FIG. 2, the sputtering yield for deposited material on one material region (39 or 41) even though the processing conditions are identical, will be different.

Pursuant to the above description, there will be one bias voltage for which net deposition on region 39 is zero, and a different bias voltage for which net deposition on region 41 is zero.

The difference in bias voltage for zero net deposition on region 39 and region 41 may not be entirely dependent on the particular difference in material. That is, where one material is aluminum and the other is tungsten, for example, the values of bias voltage for which net deposition is zero may be largely due to the metallurgical difference, but may also be due to differences in thickness, topology (roughness), grain structure, and other characteristics. Given two regions 39 and 41 of the same material, say aluminum, difference in specularity, for example, might provide for a difference in radiation from the two surfaces, causing one region to exhibit a marginally different temperature than the other, providing therefore a difference in the bias voltage at which zero net deposition is exhibited for the two regions.

There are, indeed, a fair number of ways that such differences may be employed and exploited in SPD, such that SPD may be practiced on substrates based not just on the regions being formed of different materials, but on the regions having differing surface chemistry characteristics, whether or not the surfaces are of different materials.

Figure 3:
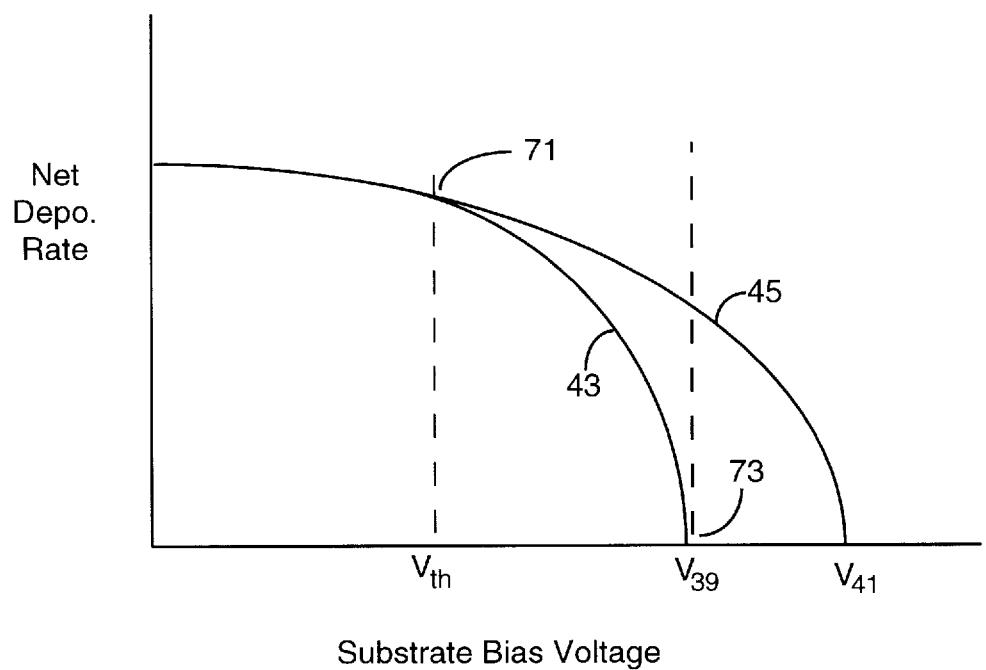
FIG. 3 is a generalized plot of net deposition rate on surfaces of substrate 37 of FIG. 2 against bias voltage.

FIG. 3 is a generalized plot of net deposition rate on surfaces of substrate 37 of FIG. 2 against bias voltage. Curve 43 is for region 39 and curve 45 is for region 41. At a relatively low bias voltage, below a threshold $V_{TH}$, the curves coincide. At bias voltage $V_{39}$ the net deposition rate for the primary sputtered species on region 39 is zero. At bias voltage $V_{41}$ the net deposition rate for region 41 is zero. At $V_S$ from 0 to $V_{39}$ there is net deposition on both regions. At any $V_S$ above $V_{41}$ there is no deposition on the substrate, as any arriving atomic flux is back-sputtered away before nucleation and film formation can occur.

Between $V_{39}$ and $V_{41}$ there exists a selective processing window wherein primary sputtered species may be deposited on region 41 with no deposition on region 39.

FIG. 3 illustrates the general condition for areal SPD, dependent on material differences and differences in surface characteristics at different regions of a substrate. As described above, however, the energy of incident flux J to accomplish the selective deposition is often high enough to cause damage to material structures on the substrate. SPD exploits techniques for reducing and controlling $E_{SB}$ to allow selective deposition to be employed with bias voltages low enough to ensure arriving energies are low enough to avoid such damage. A crucial element in system design is precise control of flux.

The technique for reducing and controlling $E_{SB}$ in SPD involves controlled introduction of gaseous species in the processing volume. Such gaseous species, herein called control species, necessarily appear at the point of process simply by diffusion. A portion of the control species is also ionized in the plasma, and this portion may be accelerated to the substrate by virtue of the substrate bias voltage. The control species influences the $E_{SB}$ of the growing film, allowing zero net deposition to be accomplished in one region of a substrate while positive net deposition occurs in an other region; all at a relatively low substrate bias voltage.

SPD has been accomplished by the inventors, as an example of SPD from a solid source, depositing TiW (titanium tungsten) sputtered from a 4–9's pure $Ti_{0.1}W_{0.9}$ sputtering target in a magnetron sputtering apparatus, wherein the plasma is magnetically enhanced. The general system of FIG. 1 serves for this exemplary SPD process.

The substrates in this exemplary process are silicon wafers having aluminum dots 1 $\mu$m in thickness and 1 or 3 mm in diameter. The goal is to deposit TiW on the aluminum while avoiding deposition on the silicon.

The base pressure in the deposition system is $5 \times 10^{-7}$ Torr. Auger electron spectroscopy (AES) is used to determine elemental composition at and immediately below the surface, using a Perkin-Elmer Model 595 scanning Auger microprobe. Film thicknesses are measured with an alpha step microprofilometer.

In sample preparation in this example of SPD for TiW, film growth is preceded in the system of FIG. 1 by etching of the surface of the sputtering target with the substrates covered (shields for this purpose are not shown in FIG. 1). After target etching, the substrates are lightly etched before deposition begins.

Sputtering gas pressures are measured in process using a Convectron gauge adjusted for nitrogen. TiW films are deposited using approximately 25 mTorr of argon and about 2 mTorr of either $CF_4$ or $N_2$.

Figure 4:
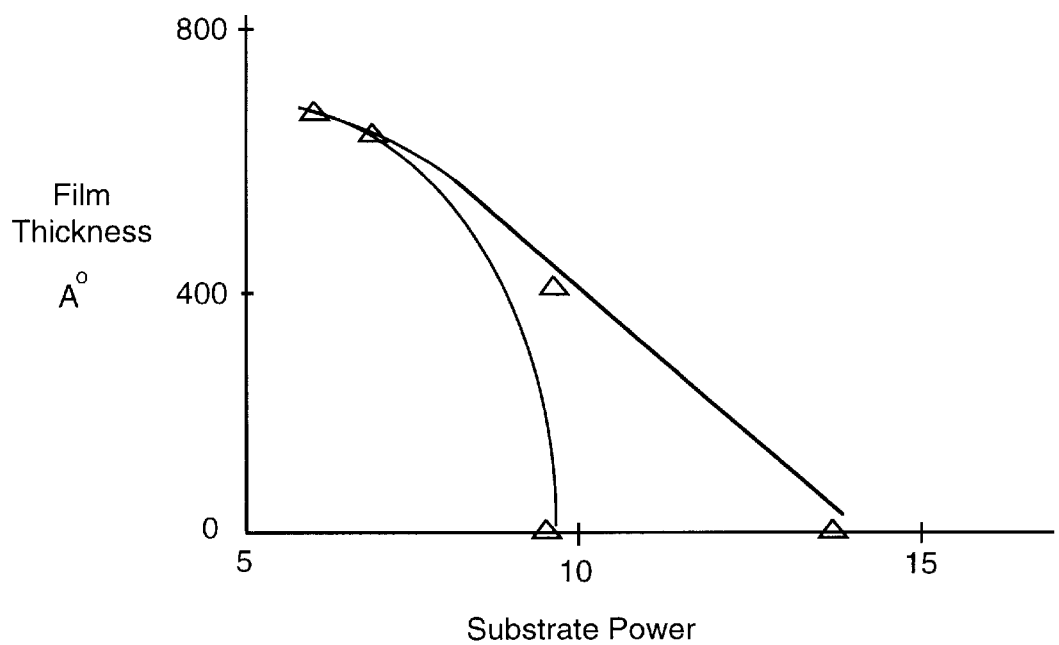
FIG. 4 shows the results of deposition of control samples with substrate power in watts plotted against film thickness in Angstrom units.

To illustrate the beneficial effects of SPD, control samples were prepared using Ar alone. FIG. 4 shows the results of deposition of control samples with substrate power in watts plotted against film thickness in Angstrom units.

Experimental points are represented by triangles in FIG. 4, and the connecting curves are extrapolated to indicate expected results under other conditions. For FIG. 4, power to the sputtering target is 50 watts and deposition time is about 15 minutes for each sample.

As expected, the deposition rate is greatest for the least substrate power, and is about 45 angstroms per minute at 5 watts for substrate power. Up to about 7 watts for the substrate power, the measured thickness on samples is the same over the aluminum regions as over the silicon regions. At about 9 watts substrate power, the threshold is reached for zero net deposition in silicon. At about 10 watts substrate power, about 400 Angstroms of TiW is measured on the aluminum regions, with no net deposition on the silicon regions.

Above 10 watts substrate power there is still net deposition on the aluminum and none on the silicon to about 14 watts substrate power. The processing region from about 9 watts to about 14 watts substrate power under these experimental conditions is the selective processing region. As substrate power increases in this region, there is less net deposition of TiW on the aluminum regions, and the silicon is increasingly etched.

Above about 14 watts substrate power there is no net deposition on either the aluminum or the silicon surfaces of the wafer, and both surfaces are etched.

For argon sputtering FIG. 4 represents the only selective scenario for selective deposition of TiW on aluminum on a substrate with regions of silicon. In SPD, addition of a few percent of reactive gas to the plasma creates a unique circumstance.

Figure 5:
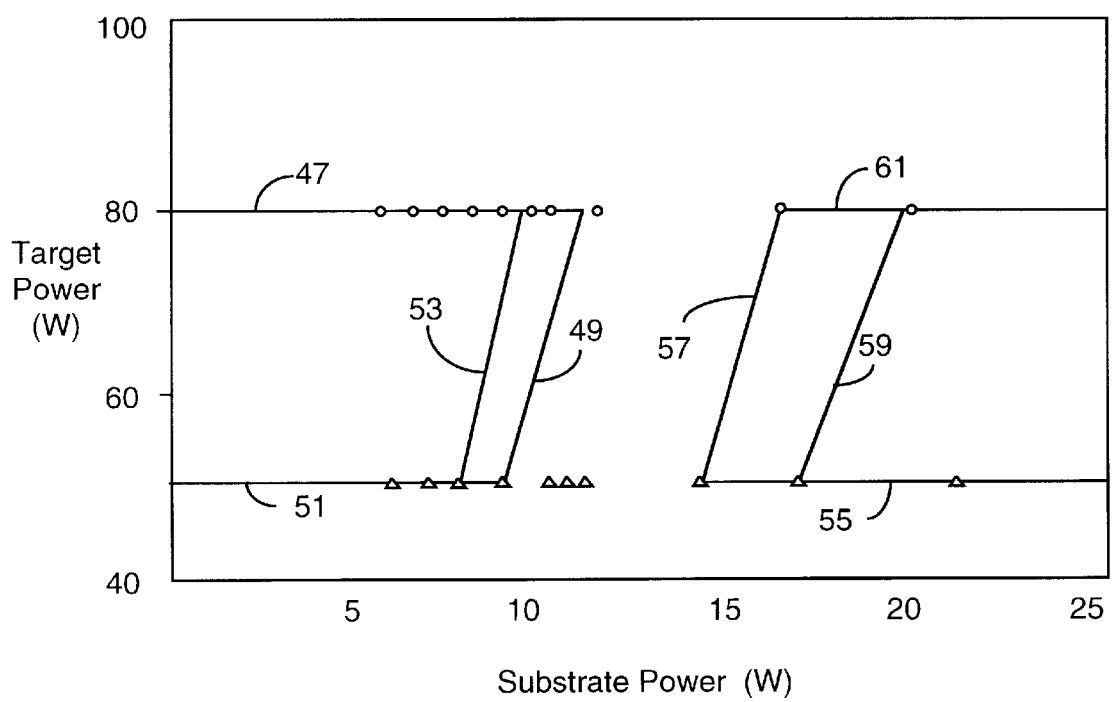
FIG. 5 is a selective deposition map for TiW in an embodiment of SPD.

FIG. 5 is a selective deposition map for TiW in an embodiment of SPD with substrate power and target power plotted along the x and y axes respectively. The area for selective deposition in the map is the area between the enclosed regions, and represents the conditions under which deposition takes place on the aluminum surfaces of a substrate but not on the silicon surfaces.

In FIG. 5, lines on the deposition map are numbered as an aid in this description. The area bounded by lines 47, 49, 51, and the left edge of the plot represents conditions under which TiW is deposited on the entire substrate area, both aluminum and silicon surfaces, using an argon plasma alone. The area bounded by lines 55, 57, 61, and the right edge of the plot is the area for argon sputtering wherein there is no net deposition on the substrate, either silicon or aluminum surface. The region between these two bounded areas is the selective process region where net deposition occurs on the aluminum surfaces, but not on the silicon surfaces.

The deposition map shows that addition of a reactive gas to the plasma favorably influences the selective region. Samples were prepared with all the same conditions for the argon sputtered samples, except $CF_4$ was flowed in the processing volume at a partial pressure of about 2 mTorr along with argon at about 25 mTorr. Lines 53 and 59 indicate the edges of a broader selective region due to the introduction of $CF_4$. The phase space for selectivity is about doubled, which allows for a higher deposition rate.

As another example of SPD from a solid source, SPD has been accomplished sputtering aluminum from a solid source in the presence of argon and nitrogen, or 100% nitrogen. The deposited film is a reactive product, $Al_xO_yN_z$, providing the first known selectively deposited electrically insulating film. In this example, net deposition of the insulating $Al_xO_yN_z$ film is on the silicon areas of the sample substrate, with no net deposition on the aluminum areas. This indicates the bias threshold is higher for the silicon surface than for the aluminum surface. In this case, the bias threshold is best illustrated with reference to FIG. 4, which shows the film thickness accumulated on surface regions of two different materials as a function of substrate bias power. The point that the thickness vs. power curve for a material surface crosses the horizontal axis is said to be the bias threshold value.

The deposition rate for selective deposition of $Al_xO_yN_z$ was about 10 angstroms per minute. The incorporation of oxygen in the film was not intentional, and oxygen was not introduced into the deposition chamber in the original experiments. The low deposition rate is believed to be responsible for the oxygen incorporation from partial pressure of oxygen bearing gases inherent in the sputter deposition system, known to be about $1 \times 10^{-7}$ Torr.

Auger depth profile of the $Al_xO_yN_z$ film revealed a composition of about 58% Al, 32% Nitrogen, and 10% Oxygen. The difference is not 50—50, but this is believed to be due to preferential sputtering during AES depth profiling.

Impedance of the insulating film was measured to be greater than 30 MΩ, with a refractive index of about 1.78.

SPD From a Gaseous Source

SPD may proceed from a gaseous source as well as from a solid source. In this case the process more closely resembles plasma-enhanced CVD with the addition of controlled substrate bias.

Conventional selective CVD processes are high thermal budget processes, typically operating with a substrate surface temperature of from 400° to 500° C., which precludes use of most polymer dielectric materials. Also, CVD processes are known for only a relative few metal systems which would be useful in many applications. Many metals simply do not form volatile species that may be used as gaseous sources in CVD process.

Figure 6A:
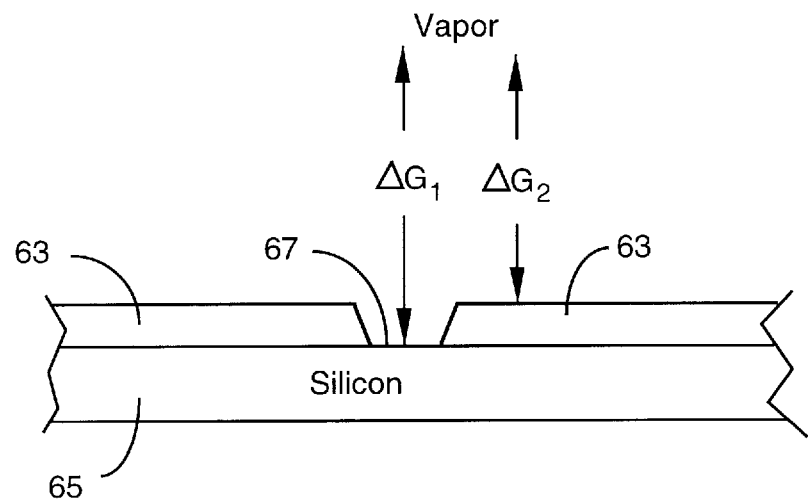
FIG. 6A illustrates the initial stages of a process for selective deposition of W on silicon through vias.

One CVD process amenable to SPD techniques is the well-known selective deposition of W on silicon contacts through vias in a layer of $SiO_2$. FIG. 6A illustrates the initial stages of the process, wherein elemental silicon surface 67 is exposed to vapor including $WF_6$ through an oxide layer 63 over a silicon wafer 65, and the silicon acts as the predominating reducing agent. A thin layer of tungsten grows over the exposed silicon.

Figure 6B:
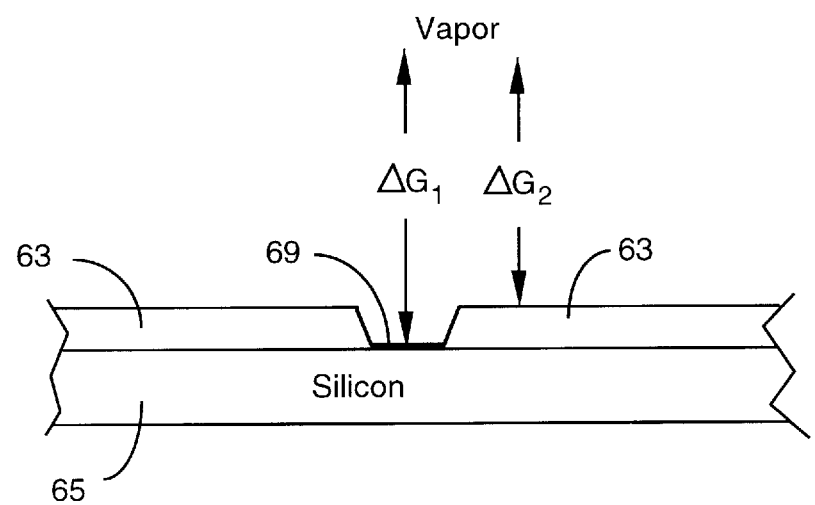
FIG. 6B illustrates the process of FIG. 6A after the silicon is covered with W and a gaseous reducing agent is added.

Once metal has covered the exposed silicon, silicon can no longer support the reduction of metal from the vapor phase. A new reducing agent is required. Typically a gaseous reducing agent, such as $H_2$, is added at this point in the process, as shown in FIG. 6B. It is well known that growth of the metal film can be maintained at a low supersaturation while heterogeneous nucleation requires higher supersaturation. This means that growth on the already deposited film may be maintained, while no nucleation will occur on the $SiO_2$ surfaces outside the contact areas. This is the reason the concentration of $WF_6$ is kept low compared to the hydrogen concentration.

A SPD process for selective W on a $SiO_2$/Si substrate injects F into the gas mixture, and utilizes injection of electrons at 30–60 eV to form a plasma of the gas mixture. The substrate is biased, just as described for the SPD processes from a solid source. $F_2$ may be added to the gas mixture with the conventional $WF_6$, $H_2$, and Ar.

A cracking pattern for $WF_6$ is obtained with the predominant species being $WF_4$. This fraction and other species formed in the plasma bombard the surface with energies from 10 to 100 eV. At elevated $T_S$ some $WF_6$ also adsorbs on the surfaces of the substrate. Each of the $WF_x^0$ species, where 0 is the neutral species and x varies from 1–6, has a unique adsorption neutral phase.

In the SPD process, ionized $WF_x^+$ species impact the substrate surface at sufficient energy to fracture most of the remaining F from the W. Other ions bombarding the substrate surface include $F_x^{+/0}$, $H_x^{+/0}$, $Ar^{+/0}$, and $Ne^{+/0}$, plus a small fraction of intermixed compounds formed in the plasma.

At high $T_S$ many of the adsorbed $WF_x$ species will desorb, and at the same time physical sputtering of the substrate surface removes some of the weakly bound species from the $SiO_2$ surfaces at a rate higher than for the Si surfaces. The low energy bombardment of the substrate helps form weakly bound fluoride fragments while the H helps form weakly bound HF for gettering excess F from the substrate surfaces.

During the SPD process, ion bombardment serves three primary purposes. (1) covering the surfaces with reactive species to lower $E_{SB}$, (2) depositing energy at the surface to preferentially remove weakly bonded species such as the $WF_x$ from the $SiO_2$, and (3) activating enough reactive species such as H to minimize substrate etching by removing excessive amounts of the reactive gas species. In the case of W deposition on Si and $SiO_2$, spontaneous etching of $SiO_2$ does not proceed in the presence of F atoms, unless some bond-breaking energy (about 35 eV) is present. Si compounds with F and other volatile fluoride compounds will spontaneously etch in the presence of F atoms at the surface.

The SPD process uses ion bombardment to enhance the deposition process and to lower the necessary selective deposition temperature, and uses reactive additives to the plasma to lower $E_{SB}$.

A similar and useful process to the tungsten process described above, exemplary of SPD from a gaseous source involves selective deposition of Tungsten Silicide with fluorine as an additive agent, such as in $F_2$ and $CF_4$.

Further Discussion of SPD Selective Mechanism

In the embodiments of the invention disclosed above, both PVD and CVD, many of the physical and chemical phenomena are well understood, at least empirically, and have been modeled by a number of researchers. There are, for example, well known models and explanations for the physical mechanisms of sputtering and for the chemical processes involved in reduction of volatile compounds to form a solid film of one or more elements of the compounds on a hot substrate. The precise mechanisms occurring at the surfaces of a substrate under the conditions of SPD, however, in particularly at the surface where net deposition is prevented, are much less well understood.

SPD depends on controlling nucleation of arriving material at substrate surfaces, through a combination of sputtering under the influence of ions accelerated toward the surfaces, and desorption. Moreover, in SPD, there is a definite advantage to operating near the point that deposition rate of material on one surface of the substrate just equals the removal rate. This advantage may be seen in FIG. 3, for example, wherein the net deposition rate on two different material surfaces of a substrate is plotted as a function of substrate bias voltage.

In FIG. 3, the net deposition rate for both material surfaces is seen to decrease as substrate bias voltage is increased. This is the expected result, as the average energy of bombarding species is increased as substrate bias is increased, thereby increasing the sputtering rate. At point 71, at bias voltage $V_{TH}$, the two rate curves begin to diverge, with curve 43 dropping off faster than curve 45. Net deposition rate for the other surface of the substrate, represented by curve 45, is falling as well, but not as quickly.

At substrate bias voltage $V_{39}$ the net deposition rate on surface 39 is zero. As substrate bias voltage is increased beyond $V_{39}$ there is no deposition on surface 39, but the net deposition rate for surface 41 decreases. Also, there begins to be a net etch rate on surface 43. The optimum operating point, then, for a selective deposition process, is with a substrate bias activity just slightly greater than that activity that balances deposition on the first surface. In FIG. 3 this is a substrate bias voltage at about point 73.

For the purposes of describing SPD it is important to remember that there is considerable activity at the surface where net deposition rate is zero. The only thing that isn't happening is a net buildup of arriving material on the surface. Whatever the mechanism of delivering coating material, either PVD (usually sputtering from a target in line-of-sight of the substrate), or CVD, there is a considerable arrival of coating material at the surface.

Arriving material in the case of PVD in SPD is in the form of mostly neutral atoms of a target material. Due to the sputtering plasma and reactive species injected in the plasma, such as the $CF_4$ in the case of TiW SPD described above, some of the arriving material will be ionized, and some chemical combination will occur in flight. There will also be chemical activity at the surface. Lastly, there is a constant bombardment of ions mostly of gaseous species, created in the plasma, such as $Ar^+$ in sputtering SPD, adding to the surface energy and back sputtering material arrived at but not yet nucleated on the surface. SPD exploits the high-energy, unstable process situation at the zero net-dep region at the one substrate surface.

SPD controls nucleation of coating material through a combination of sputtering and/or desorption. In many cases sputtering and desorption are both employed; sputtering by attracting ionized gas by virtue of substrate bias, and desorption of volatile species by control of surface temperature. The distinction between sputtering and desorption is not always perfectly clear, and is thought to depend partly upon the relative volatility of species at the process surface.

It is well known that sputter erosion depends on the kinetic energy of bombarding ions, and on the mass, density, and surface binding energy of the material at the sputtering surface, in this case surfaces of the substrate. In one well-known model, sputtering yield is defined by P. Sigmund, in *Physical Review*, 184 (1969) pp 383, and simplified here as:

$$S = \frac{3\alpha\lambda E}{4\pi_o^2 E_{SB}}$$

In this model:
S=sputtering yield in atoms per ion
$\lambda = 4M_1 M_2/(M_1+M_2)^2$ ($M_1$ is ion mass and $M_2$ is target mass)

α is a function of $M_2/M_1$

E is the ion e250 ^U $E_{SB}$ is surface binding energy, taken as the heat of sublimation for elemental materials.

Following this model, experiments have been reported investigating the effects of variations in ion energy and target mass, using argon. In these studies, surface binding energy has not been separately investigated, as it has been thought to be constant.

It is a premise of SPD that surface binding energy is not constant, and may be intentionally varied through the use of reactive gaseous additives in the plasma over the substrate. Following the Sigmund model, S should be inversely proportional to $E_{SB}$.

Figure 7:
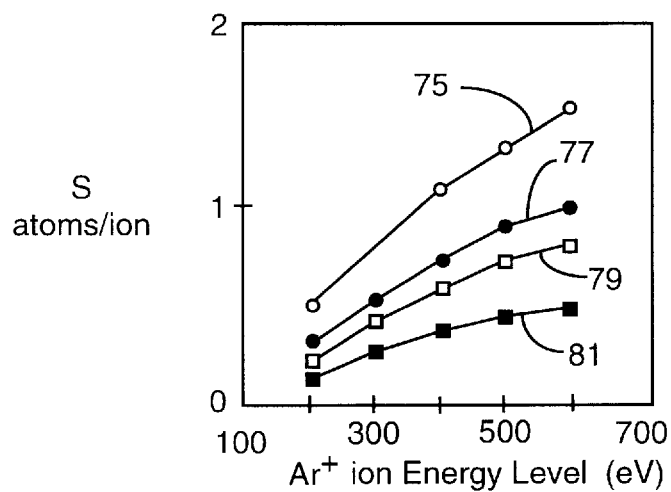
FIG. 7 is a plot of S vs. Ar+ ion energy for TiW by calculation following the Sigmund model.

FIG. 7 is a plot of S vs. Ar+ ion energy for TiW by calculation following the Sigmund model, showing four separate curves for different values of $E_{SB}$. Curve 75 for $E_{SB}$=2 eV, curve 77 for 5 eV, curve 79 for 7 eV, and curve 81 for 12 eV.

Another premise of SPD is that surface binding energy at a substrate surface can be changed by use of reactive additives, and that the changes may be used, along with ion bombardment of the substrate surfaces to enhance selective deposition, and in some cases, to create selective deposition where none was known before to exist. The addition of reactive species gives rise to simultaneous reactive sputter deposition and etching.

In the particular case of selective TiW on aluminum by SPD as described above, adsorption of the reactive fragments of the Ar+$CF_4$ plasma significantly lowers the surface binding energy of the Ti and W atoms at the substrate surfaces of both Al and Si, by producing volatile compounds when exposed to the sputtering ambient. At the same time, the $E_{SB}$ value at the aluminum surface remains higher than that for the silicon surface. In this case, the difference is greater than for conventional TiW selective deposition by biased sputtering. The net result is a wider process window for SPD, and selective deposition at lower bias sputtering energy.

Figure 8:
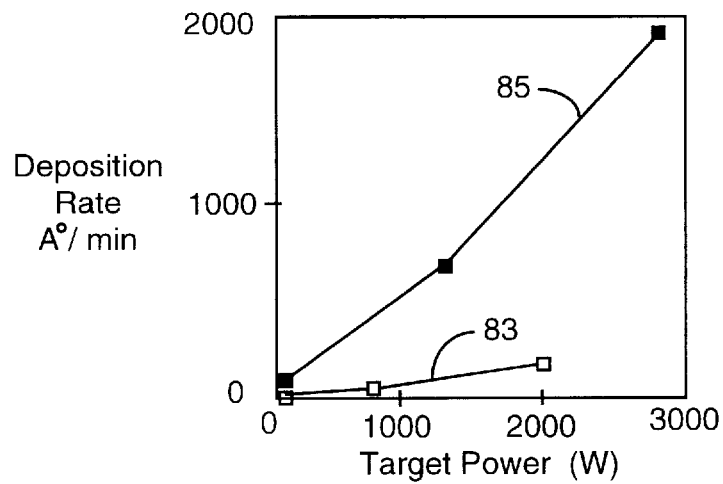
FIG. 8 is a graph of TiW deposition rate as a function of plasma composition and target power.

FIG. 8 is a graph of TiW deposition rate as a function of plasma composition and target power, to illustrate the effect of lowering $E_{SB}$ by injection of $CF_4$ in the sputtering plasma. The sputtering in this case is only at the TiW sputtering target, without bias on the substrate where deposition is measured. Curve 83 is for sputtering rate with 16 mTorr Ar, and curve 85 is for 16 mTorr Ar plus 2 mTorr $CF_4$. Target bias value for different power levels was measured and found to be within about 20V at identical power levels, indicating the increase in sputtering rate should be at most 10–20% based on the pressure and power variations, rather than the dramatic increase shown. Similarity between FIG. 8 and FIG. 7 is apparent.

In the case of selective deposition of $Al_xO_yN_z$ with injection of $N_2$ in the Ar plasma, as described above, the addition of $N_2$ may, in some cases, narrow the process window, and widen it in other cases.

Figure 9:
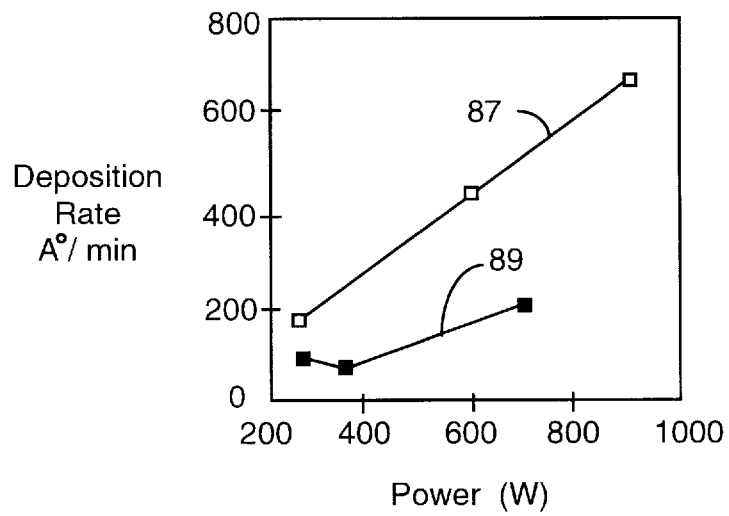
FIG. 9 is a graph of deposition rate vs target power for an aluminum target.

FIG. 9 is a graph of deposition rate vs target power for an aluminum target. Curve 87 is for 16 mTorr argon, and curve 89 is for 16 mTorr $N_2$. In this case, the use of reactive species in the plasma lowers the deposition rate dramatically, thought to be due to dramatic increase in $E_{SB}$.

SPD with material-bearing gas as the primary source material (CVD) has been described above, and it is reasonable that the same sputtering effects at the substrate should be seen as are seen for SPD with sputtering from a solid target being the primary source mechanism.

In CVD processes, the reduction of volatile species contributing solid coating material occurs at the substrate surfaces as a function of substrate surface temperature. The energy contributed by heating the substrate is the energy utilized to break the interatomic bonds of gaseous material. In an SPD/CVD process a plasma is imposed over the substrate by providing a source of energetic electrons to promote and sustain ionization (as in plasma-enhanced CVD processes). In addition, one or more reactive gaseous species are injected into the conventional CVD mixture. Added to this, substrate bias is provided for accelerating ions of gas species in the plasma to bombard the substrate surfaces. The substrate surface chemistry thus becomes much more complicated. Given the increased complexity compared to a SPD/Sputtering process, the basic mechanism is the same; that is, the reactive species alters the $E_{SB}$ of depositing species at different substrate surfaces in different degree, enhancing selective deposition.

SPD for Phase Selection

Selectivity by the techniques of SPD is not limited to areal selectivity. Different phases of a single material, for example, may exhibit variations in $E_{SB}$, which may be exploited for selective phase growth. That is, by judicious choice of gaseous additives in a plasma coating process, and careful control of substrate bias and temperature, one may select among alternative phases of a deposited material on a surface. Moreover, the selected phase growth may be made in conjunction with or in addition to selective areal deposition.

Growth of diamond and diamond-like films is an example of phase selectivity by SPD. The distinction between diamond films and diamond-like films is that diamond-like films may contain small amounts of Carbon that is not in the four-fold $sp^3$ hybridized diamond structure, but may be in $sp^2$ hybridized graphite structure. However, the physical properties of diamond, such as transparency, electrical insulation, and hardness, are also found in diamond-like films.

Diamond films are most often grown by chemical vapor deposition using a combination of $CH_4$ and $H_2$. $H_2$ is added to enhance high temperature etching of the graphite phase with respect to the diamond phase. The ratio of $H_2$ to $CH_4$ necessary to achieve diamond deposition is typically as high as 24:1, and the low concentration of Carbon in the process atmosphere limits the deposition rate.

Deposition of diamond-like films using PVD techniques alone has, to the knowledge of the inventors, never been reported because of difficulty in removing the graphite phase by ion bombardment alone. Moreover, ion bombardment produces defects that lead to formation of graphite phases in the film. Thus the process depended upon to remove the graphite phase as it develops also produces graphite phase material. There are other known techniques for depositing diamond-like films, such as cathodic-arc deposition and flame spraying.

The $E_{SB}$ of the graphite phase in deposition of diamond and diamond-like films is approximately 2–3 ev lower than the diamond phase. This $E_{SB}$ difference may be exploited for deposition of diamond-like and diamond films using SPD in a sputter deposition configuration. In this embodiment a graphite sputtering target is used in a magnetically-enhanced sputtering apparatus to deposit on nominal four-inch silicon wafers with a 1 μm thick copper film. Copper as a substrate material provides a very close lattice match to diamond.

In the SPD process, growth of diamond-like film is achieved using a moderate substrate bias and a plasma atmosphere of $CF_4$ and Ar. No $H_2$ is used in the process. Substrate heating in this case is through plasma effects only.

In this example of SPD, selectivity is not over an area of material different from another area of material on the substrate, but to diamond phase Carbon rather than graphite phase Carbon over the entire substrate. The selectivity is accomplished by removing the graphite phase at a more rapid rate than removing the diamond phase, and controlling the bias characteristics at the substrate surface to operate in the window where there is no graphite phase growth, but there is still diamond phase growth.

The process window for diamond film growth by SPD may be enhanced by addition of fluorine (F) species to the plasma, reducing the $E_{SB}$ of both the graphite and the diamond phase. It is believed that the $E_{SB}$ of the graphite phase is reduced more than that of the diamond phase. Fluorine species also provides a capability for reactive ion etching, which also etches graphite faster than diamond, allowing for further improvement.

Figure 10:
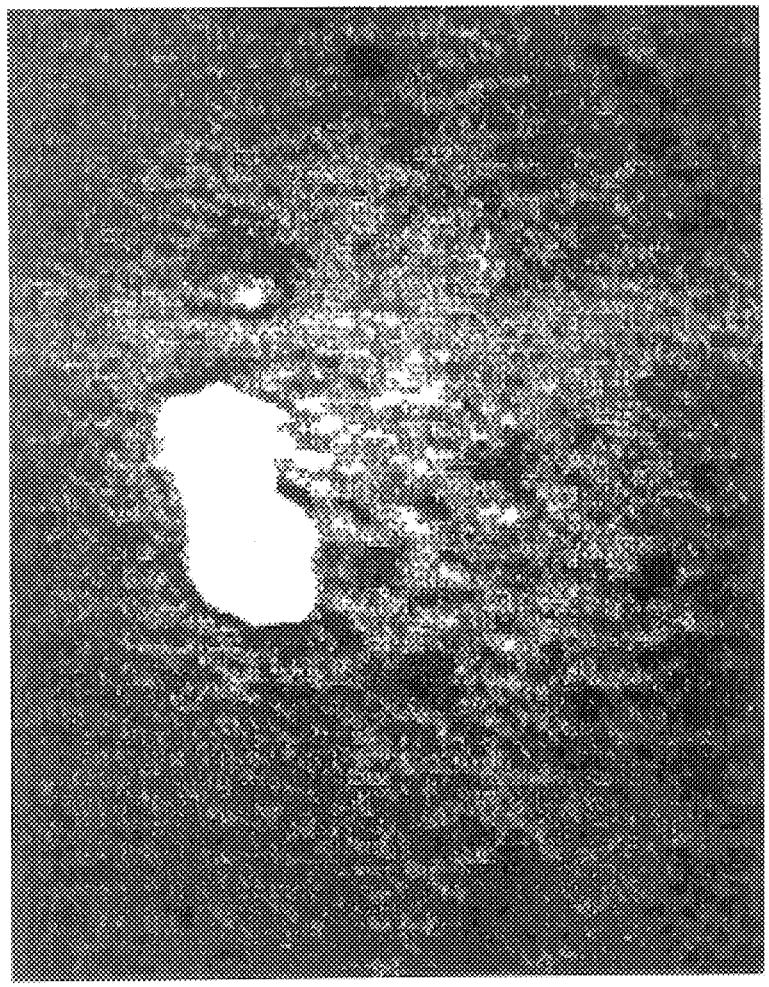
FIG. 10 is a photograph of diamond material deposited in a selective process according to the present invention.

FIG. 10 is a photograph of a diamond-like film prepared by the process described above, showing a particle that is believed to be composed of diamond crystals of about 30 $\mu$m in size. Crystals of about this size are found elsewhere in the film, but the density of such features is not high.

The crystal in FIG. 10 is embedded in a diamond-like matrix. Fluorine was not detected in the film by Auger Electron Spectroscopy, indicating that very little of the gases used in the process were incorporated in the film during growth. Films grown by this technique are up to 5000 Angstroms thick, and are both insulating and transparent.

Figure 11:
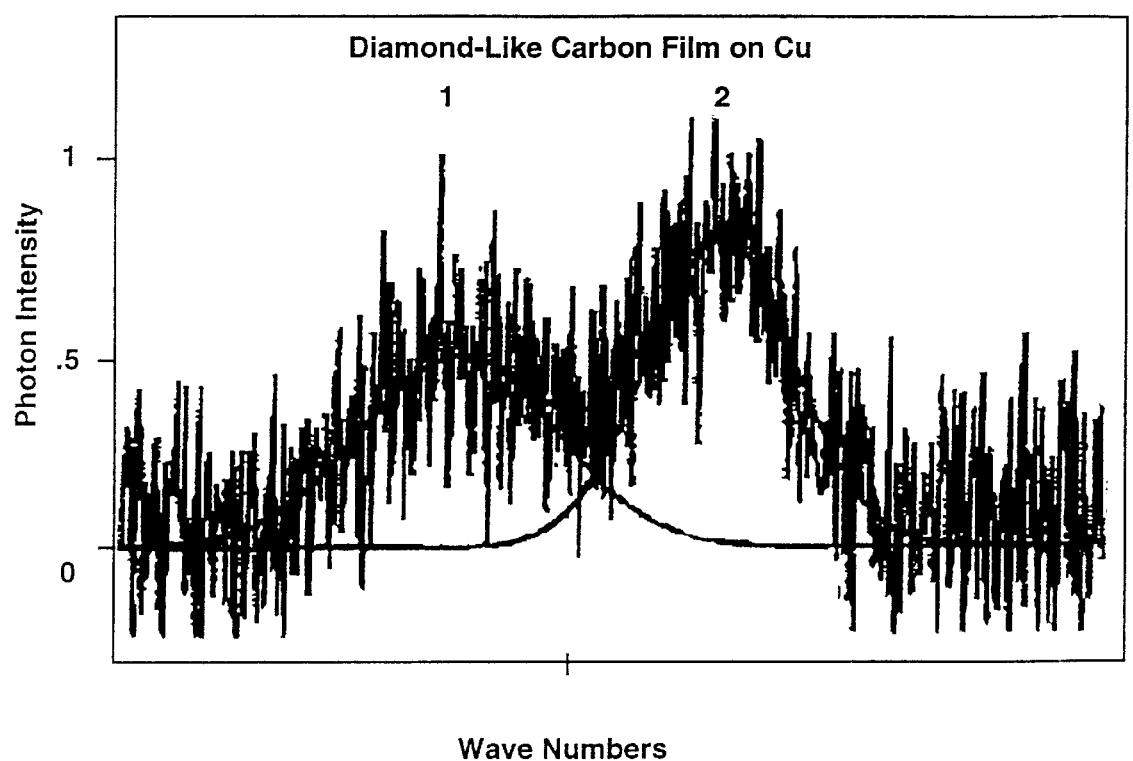
FIG. 11 is a Raman spectrum of reflected photon intensity from a diamond-like film deposited in a process according to the present invention.

FIG. 11 is a Raman spectrum from the diamond-like film of FIG. 10. There are two broad, Gaussian-shaped peaks 1 and 2 in the spectrum for the film. Peak 1 is near the value expected for single crystal diamond. The peak is shifted slightly and broadened due to the high defect density apparent in the film. This high defect density is thought to be due to film growth without direct substrate heating. Peak 2 is due to the graphite phase material still present in the film. The peak for graphitic phase material is being enhanced, however, by fluorescence from the peak for diamond phase material, making it difficult to determine the concentrations for each phase.

In contract to the spectrum illustrated in FIG. 11, a spectrum for graphite will show no peak at all for diamond phase material. This result clearly indicates that diamond phases are clearly present, which, together with the transparency and electrically insulating property, indicate a diamond-like film. With substrate heating it is believed the graphite phase may be significantly reduced, or perhaps eliminated altogether.

The diamond-like film grown by SPD on copper-coated silicon is the first to be accomplished to the knowledge of the present inventors without the use of hydrogen.

SPD is believed to be applicable for selective deposition of a broad range of compounds and materials for which selective deposition has not before been predicted or demonstrated, and selectivity may be either areal or phase selectivity, or a combination of both.

It will be apparent to those with skill in the art that there are many alterations that might be made to the embodiments herein described, without departing from the spirit and scope of the invention. Moreover, there are many selective processes not described as specific embodiments herein that are SPD processes within the spirit and scope of the present invention by virtue of alteration of $E_{SB}$ at substrate surfaces, and as such, are within the spirit and scope of the invention.

What is claimed is:

1. A method for performing area-selective deposition comprising steps of:

(a) placing a substrate having a surface with a first substrate surface region and a second substrate surface region on a substrate support in a deposition chamber, wherein the first substrate surface region and the second substrate surface region have a different physical surface characteristic;

(b) forming a gas plasma over the substrate surface by means of a plasma power supply acting through an electrode other than the substrate support;

(c) introducing one or more elemental components to be deposited on the substrate surface into the plasma, causing the one or more elemental components to deposit on the first and second substrate surface regions;

(d) electrically biasing the substrate surface to a common bias value over both the first and the second substrate surface regions by a bias power supply separate from the plasma power supply and connected to the substrate support, thereby attracting ions from the plasma to bombard both the first and second substrate surface regions, net deposition rate on any region then being the algebraic sum of a positive deposition rate from step (c) and a negative backsputtering rate caused by the ion bombardment due to the substrate bias; and (e) recognizing that the different physical surface characteristic of the first and the second regions as recited in the step (a) result in a difference in binding energy at the surface of each region in deposition of the one or more elemental components to be deposited, providing therefore a different net deposition rate for each region, adjusting the common bias value applied to the substrate surface by the bias power supply to a bias value at which positive net deposition occurs on only the first substrate surface region to form a solid film thereon.

2. The method of claim 1 comprising a further step for introducing a control gas into the plasma along with the one or more elemental components, the control gas selected for ability to alter the surface binding energy ($E_{SB}$) for the one or more elemental components at the substrate surface in one or both of the first and second regions.

3. The method of claim 1 wherein the one or more elemental components are introduced into the plasma in one or more gaseous compounds.

4. The method of claim 1 wherein the one or more elemental components are introduced into the plasma from one or more targets comprising the one or more elemental components through bombardment of the one or more targets by ions from the plasma accelerated to the one or more targets by electrically biasing the one or more targets.

5. The method of claim 4 wherein one of the one or more targets is biased by dc electrical potential.

6. The method of claim 5 wherein the plasma at one of the one or more targets is magnetically enhanced.

7. The method of claim 4 wherein one of the one or more targets is electrically non-conductive and is biased by an alternating potential.

8. The method of claim 7 wherein the alternating potential has a frequency in the RF range.

9. The method of claim 3 wherein one of the one or more elemental components is tungsten (W) and is introduced into the plasma as $WF_6$.

10. The method of claim 9 further comprising a step for introducing a control gas into the plasma along with the $WF_6$, the control gas selected for ability to alter surface binding energy ($E_{SB}$) for tungsten at the substrate surface in one or both of the first and second regions.

11. The method of claim 10 wherein the control gas is a fluorine-bearing gas.

12. The method of claim 11 wherein the fluorine-bearing gas is one of $F_2$ or $CF_4$.

13. The method of claim 3 wherein the solid film is Tungsten Silicide, the tungsten introduced into the plasma by introducing Tungsten Hexafluoride and the silicon introduced into the plasma by introducing Silane.

14. The method of claim 13 further comprising a step for introducing a control gas into the plasma along with the tungsten hexafluoride and silane, the control gas selected for ability to alter surface binding energy ($E_{SB}$) for one or both of the tungsten or the silicon at the substrate surface in one or both of the first and second regions.

15. The method of claim 14 wherein the control gas is a fluorine-bearing gas.

16. The method of claim 15 wherein the fluorine-bearing gas is one of $CF_4$ or $F_2$.

17. The method of claim 4 having one elemental component and one target, wherein the target and the elemental component are tungsten.

18. The method of claim 17 further comprising a step for introducing a control gas into the plasma along with the tungsten hexafluoride and silane, the control gas selected for ability to alter the surface binding energy ($E_{SB}$) for one or both of the tungsten or the silicon at the substrate surface in one or both of the first and second substrate surface regions.

19. The method of claim 18 wherein the control gas selected to alter the surface binding energy is $N_2$.

20. The method of claim 4 wherein the elemental components are titanium and tungsten and the target is a composite target of titanium and tungsten.

21. The method of claim 20 further comprising a step for introducing a control gas into the plasma along with the titanium and tungsten, the control gas selected for ability to alter the surface binding energy ($E_{SB}$) for one or both of the titanium or the tungsten at the substrate surface in one or both of the first and second substrate surface regions.

22. The method of claim 20 wherein the control gas is one of $CF_4$ and $N_2$.

23. The method of claim 1 wherein the difference in physical characteristic between the first substrate surface region and the second substrate surface region is a difference in elemental constituent content.

24. The method of claim 1 wherein the difference in physical characteristic between the first substrate surface region and the second substrate surface region is a difference in grain structure.

25. A method for phase-selective deposition on a substrate, comprising steps of:

(a) placing a substrate having a surface upon which deposition of a first physical phase of an element or compound is desired in a deposition chamber upon a substrate support which may be electrically biased by a bias power supply;

(b) establishing a plasma deposition process wherein the element or compound desired deposits on the substrate in both the first physical phase and a second physical phase;

(c) providing a bias value to the substrate support, such that ions from the plasma are attracted to and bombard the substrate surface, causing thereby a backsputtering effect; and (c) recognizing that the positive deposition rate for each of the first and the second physical phases will differ under identical deposition conditions, and that the net deposition rate for the first and second physical phases will differ and decrease with increased substrate bias because the backsputtering rate will increase, there being thereby a point of bias value as bias is increased at which the net deposition rate for the second physical phase will become zero while the net deposition rate for the first physical phase other is still positive, adjusting the bias value to a value at which only the net deposition rate for the first physical phase is positive thereby selectively depositing the first physical phase in a film.

26. The method of claim 25 further comprising a step for introducing a control gas into the plasma along with a source of the element or compound, the control gas selected for ability to alter surface binding energy ($E_{SB}$) for at least one of the physical phases at the substrate surface.

27. The method of claim 25 wherein a source of the element or compound is introduced into the plasma as a gaseous material.

28. The method of claim 25 wherein a source of the element or component is introduced into the plasma from a target through bombardment by ions from the plasma accelerated to the target by electrically biasing the target.

29. The method of claim 28 wherein the element or compound is Carbon, the target is graphitic-phase carbon, and the first physical phase is diamond-phase carbon.

30. The method of claim 29 further comprising a step for introducing a control gas into the plasma along with the carbon, the control gas selected for ability to alter surface binding energy ($E_{SB}$) for one of the physical phases at the substrate surface.

31. The method of claim 30 wherein the control gas introduced into the plasma is a fluorine-bearing gas.

32. The method of claim 31 wherein the control gas is $CF_4$.

* * * * *